(12) United States Patent
Zeng (10) Patent No.: US 11,665,839 B2
(45) Date of Patent: May 30, 2023

(54) FLEXIBLE DISPLAY DEVICE (71) Applicant: WUHAN CHINA STAR OPTOELECTRONICS SEMICONDUCTOR DISPLAY TECHNOLOGY CO., LTD., Hubei (CN)

(72) Inventor: Jie Zeng, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 86 days.

(21) Appl. No.: 17/275,211

(22) PCT Filed: Dec. 29, 2020

(86) PCT No.: PCT/CN2020/140677
§ 371 (c)(1),
(2) Date: Mar. 11, 2021

(87) PCT Pub. No.: WO2022/126752
PCT Pub. Date: Jun. 23, 2022

(65) Prior Publication Data
US 2022/0192039 A1 Jun. 16, 2022

(30) Foreign Application Priority Data
Dec. 16, 2020 (CN) .......................... 202011490737.8

(51) Int. Cl.
*H05K 5/00* (2006.01)
*H05K 5/02* (2006.01)

(52) U.S. Cl.
CPC ......... *H05K 5/0217* (2013.01); *H05K 5/0017* (2013.01)

(58) Field of Classification Search
USPC .................. 361/728, 755, 807, 809 and, 810
See application file for complete search history.

(56) References Cited

U.S. PATENT DOCUMENTS

| 2012/0307472 | A1 | 12/2012 | Bohn et al. |
| 2016/0081204 | A1* | 3/2016 | Park ................... H04M 1/0268 361/807 |

(Continued)

FOREIGN PATENT DOCUMENTS

| CN | 104732890 A | 6/2015 |
| CN | 106095195 A | 11/2016 |

(Continued)

*Primary Examiner* — Hung S. Bui
(74) *Attorney, Agent, or Firm* — The Roy Gross Law Firm, LLC; Roy Gross (57) ABSTRACT

The present application discloses a flexible display device, including: a supporting base, wherein the supporting base includes a first sliding base and a second sliding base, and a flexible display screen, wherein the flexible display screen includes a first part, a second part, and a connecting part connecting the first part with the second part. The first part is fixedly connected to the first sliding base, and the second part is slidably connected to the second sliding base along a first direction. The first sliding base and the second sliding base are slid in opposite directions along the first direction, thereby changing a length of the connecting part along the first direction.

15 Claims, 3 Drawing Sheets

(56) References Cited

U.S. PATENT DOCUMENTS

| | | | |
|---|---|---|---|
| 2017/0278436 A1 | 9/2017 | Chu | |
| 2018/0049328 A1 | 2/2018 | Choi et al. | |
| 2018/0103552 A1* | 4/2018 | Seo | G06F 1/1652 |
| 2020/0152095 A1* | 5/2020 | Lee | G06F 1/1641 |
| 2020/0253063 A1 | 8/2020 | Jiang | |
| 2020/0329572 A1* | 10/2020 | Wittenberg | H05K 5/0017 |
| 2021/0373603 A1* | 12/2021 | Feng | G06F 1/1624 |

FOREIGN PATENT DOCUMENTS

| | | | |
|---|---|---|---|
| CN | 106157816 A | 11/2016 | |
| CN | 106652798 A | 5/2017 | |
| CN | 106790829 A | 5/2017 | |
| CN | 107424518 A | 12/2017 | |
| CN | 107731098 A | 2/2018 | |
| CN | 108040154 A | 5/2018 | |
| CN | 110033707 A | 7/2019 | |
| CN | 110428732 A | 11/2019 | |
| CN | 110493398 A | 11/2019 | |
| CN | 110718148 A | 1/2020 | |
| CN | 111508374 A | 8/2020 | |

\* cited by examiner

FLEXIBLE DISPLAY DEVICE

FIELD

The present disclosure relates to the field of the display technologies and, more particularly, to a flexible display device.

BACKGROUND

Flexible organic light-emitting diodes (OLEDs) are bendable and flexible, and therefore have attracted much attention. Currently, space occupied by large flexible screens can be reduced by rolling up the flexible OLED display devices, thereby improving portability. Thus, rollable display devices are a main research direction in the flexible OLED field.

However, although portability of conventional flexible OLEDs can be improved by rolling up, flexible display screens are relatively soft. As a result, it is inconvenient to touch and control the flexible display screens when they are hand-held.

Regarding the technical problem: in conventional OLED display devices, it is inconvenient to touch and control flexible display screens when they are hand-held because they are relatively soft.

SUMMARY

A flexible display device, including:

a supporting base, wherein the supporting base comprises a first sliding base and a second sliding base which are slidably connected to each other in a first direction, the first sliding base comprises a first surface, and the second sliding base comprises a second surface away from the first surface;

a flexible display screen, wherein the flexible display screen comprises a first part disposed on the first surface, a first end connected to the first part, a second part disposed on the second surface, and a connecting part connected to the first part and the second part;

wherein the second sliding base further comprises a second end away from the first end, the first part and the first sliding base are fixedly connected to each other, the second part and the second sliding base are slidably connected to each other along the first direction, the connecting part bypasses the second end, and a length of the connecting part along the first direction is changed when the first sliding base and the second sliding base are slid toward opposite directions along the first direction.

In some embodiments, a flexible supporting plate is disposed between the flexible display screen and the supporting base, and is fixedly connected to the flexible display screen.

In some embodiments, the flexible supporting plate comprises a fixed part corresponding to the first part, a sliding part corresponding to the second part, and a supporting part corresponding to the connecting part, and the flexible display screen is attached to the flexible supporting plate; and wherein the fixed part is fixedly connected to the first sliding base, the sliding part is slidably connected to the second sliding base along the first direction, and a length of the supporting part is changed when the first sliding base and the second sliding base are slid toward opposite directions along the first direction.

In some embodiments, two sides of the second surface are provided with a position-limiting blocking strip connected to the second sliding base along a second direction, a chute is defined between the position-limiting blocking strip and the second surface along the first direction, a lateral side of the sliding part is disposed in the chute along the second direction, and the second direction is perpendicular to the first direction.

In some embodiments, the second part is disposed between two position-limiting blocking strips, and a gap is defined between the second part and each of the two position-limiting blocking strips.

In some embodiments, a position between the sliding part and the position-limiting block strip and a position between the sliding part and the second surface are provided with a lubricating layer.

In some embodiments, the fixed part of the flexible supporting plate is attached to the first surface.

In some embodiments, the flexible supporting plate further comprises a first supporting end corresponding to the first end of the flexible display screen, the first sliding base comprises a third end away from the second end, the third end is provided is a curved surface, and the first supporting end is attached to the curved surface to form a curved edge part.

In some embodiments, a first fixed block is disposed on the second surface, a second fixed block is disposed on the sliding part of the flexible supporting plate, the first fixed part is positioned between the second fixed block and the sliding part and is disposed on a sliding trajectory of the second fixed block; and wherein the second fixed block is against the first fixed block when the first sliding base is slid to a predetermined position along a direction away from the second sliding base.

In some embodiments, a position-limiting recess extending along the first direction is defined on the second sliding base, the first fixed block is disposed in the position-limiting recess, and part of the second fixed block is disposed in the position-limiting recess.

In some embodiments, an upper surface of the first fixed block is lower than or aligned with the second surface.

In some embodiments, the first sliding base is disposed on a side of the second sliding base away from the second surface, a T-shaped sliding block is disposed on one of the first sliding base or the second sliding base, a T-shaped chute corresponding to the T-shaped sliding block is disposed on the other one of the first sliding base or the second sliding base, and the first sliding base and the second sliding base are slidably connected to each other by the T-shaped sliding block and the T-shaped chute along the first direction.

In some embodiments, the flexible display device further includes a supporting shaft disposed along the second direction, the supporting shaft is disposed at the second end, and the second direction is perpendicular to the first direction;

wherein the connecting part bypasses a side of the supporting shaft away from the second end, a vertex of the supporting shaft away from the sliding part is aligned with the first surface; and wherein changes in length of the connecting part along the first direction are equal to changes in length of the second part along the first direction when the first sliding base and the second sliding base are slid toward opposite directions along the first direction.

In some embodiments, the supporting shaft rotates around itself and is connected to the second end.

In some embodiments, an end of the first sliding base near the second end is provided with a curved surface, and the curved surface is attached to a surface of the supporting shaft when the first sliding base is against the supporting shaft.

Regarding the beneficial effects: due to a first sliding base and a second sliding base, flexible display screens can be supported when being controlled by touching, which is beneficial for controlling the flexible display screens by touching. In addition, people can feel flexible display screen less dented when they touch and control the flexible display screens. Furthermore, the first sliding base and the second sliding base can be slid toward opposite directions along a first direction. Therefore, a display area of a display part of flexible display screens disposed on a front side of the sliding base can be changed. Thus, flexible display screens can switch between a folded state and an unfolded state.

DESCRIPTION OF DRAWINGS

Technical solutions and beneficial effects of the present disclosure are illustrated below in detail in conjunction with drawings and specific embodiments.

REFERENCE NUMBERS flexible display screen 10; first part 11; connecting part 12; second part 13; first end 14; supporting base 20; first sliding base 21; first surface 211; second sliding base 22; second surface 221; second end 222; flexible supporting plate 30; position-limiting blocking strip 40; chute 41; T-shaped chute 51; T-shaped sliding block 52; supporting shaft 60; curved surface 70; first fixed block 81; second fixed block 82; position-limiting recess 83.

DETAILED DESCRIPTION

The following description of the various embodiments is provided with reference to the accompanying drawings to demonstrate the embodiments of the present disclosure. It should be understood that terms such as "upper," "lower," "front," "rear," "left," "right," "inside," "outside," "lateral" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, the identical or similar reference numerals constantly denote the identical or similar elements or elements having the identical or similar functions.

An aim of the present disclosure is: in conventional organic light-emitting diode (OLED) display devices, it is inconvenient to touch and control flexible display screens when they are hand-held because they are relatively soft.

The present disclosure provides a flexible display device, as shown in FIGS. 1 to 6, including a supporting base 20 and a flexible display screen 10 disposed thereon.

The flexible display screen 10 can be an OLED display screen which can be bent. A side of the flexible display screen 10 away from the supporting base 20 is a display side. The flexible display screen 10 can be designed to be entirely bendable, or can be designed to be partly bendable.

The supporting base 20 is configured to support the flexible display screen 10, which is beneficial for operating the flexible display screen 10 when it is hand-held. Furthermore, when the flexible display screen 10 is controlled by touching, people can find flexible display screen 10 less dented.

Specifically, as shown in FIGS. 1 to 6, the supporting base 20 includes a first sliding base 21 and a second sliding base 22. The first sliding base 21 and the second sliding base 22 are slidably connected to each other along a first direction. The first sliding base 21 includes a first surface 211. The second sliding base 22 includes a second surface 221. The flexible display screen 10 includes a first part 11 disposed on the first surface 211, a first end 14 connected to the first part 11, a second part 13 disposed on the second surface 221, and a connecting part 12 connecting the first part 11 with the second part 13. The first part 11, the first end 14, the second part 13, and the connecting part 12 are integrally formed.

The second sliding base 22 further comprises a second end 222 disposed away from the first part 14. The first part 11 and the first sliding base 21 are fixedly connected to each other. The second part 13 and the second sliding base 22 are slidably connected to each other along the first direction, and the connecting part 12 bypasses the second end 222. A length of the connecting part 12 is changed when the first sliding base 21 and the second sliding base 22 are slid in opposite directions along the first direction.

As shown in FIGS. 1 to 6, it should be noted that the flexible display screen 10 includes two ends along the first direction. One of the two ends is connected to the first part 11, and the other is connected to the second part 13. An end of the flexible display screen 10 connected to the first part 11 is the first end 14. A direction in which the first sliding base 21 and the second sliding base 22 are oppositely slid along is the first direction. In FIGS. 1 to 6, the first direction is parallel to a length direction of the supporting base 20.

The first surface 211 is defined on a front side of the supporting base 20. When the first surface 211 defined on the front side of the supporting base 20 is a display part, the second surface 221 is defined on a backside of the supporting base 20. That is, the first part 11 and the second part 13 are disposed on the front side and the backside of the supporting base 20 respectively, and the front side and the backside of the supporting base 20 are opposite to each other.

Due to the first sliding base 21 and the second sliding base 22, the flexible display screen 10 can be supported when being controlled by touching, which is beneficial for controlling the flexible display screen 10 by touching. In addition, people will find the display screen less dented when operating the display screen by touching.

Because the first sliding base 21 and the second sliding base 22 can be slid in opposite directions along the first direction, the first part 11 can be driven to move when the first sliding base connected thereto is slid along the first direction. Furthermore, because the second part 13 and the second sliding base 22 are slidably connected to each other, the second part 13 can be driven to move along the first direction by the connecting part 12. When the first sliding base 21 and the second sliding base 22 are slid in different directions along the first direction, a length of the first part 11 remains unchanged. However, the length of the connecting part 12 along the first direction changes. Therefore, a display area of a display part of the flexible display screen 10 disposed on the front side of the support base 20 can be changed. As a result, the flexible display screen 10 can switch between a folded state and an unfolded state.

Figure 1:
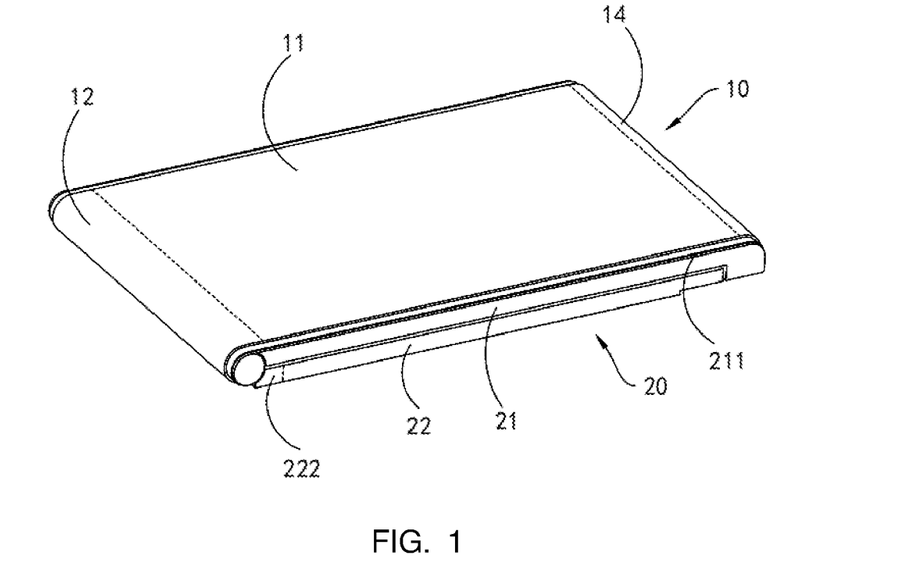
FIG. 1 is a structural schematic view showing a folded flexible display screen of the present disclosure, wherein a first surface of a first sliding base faces upward.
Figure 2:
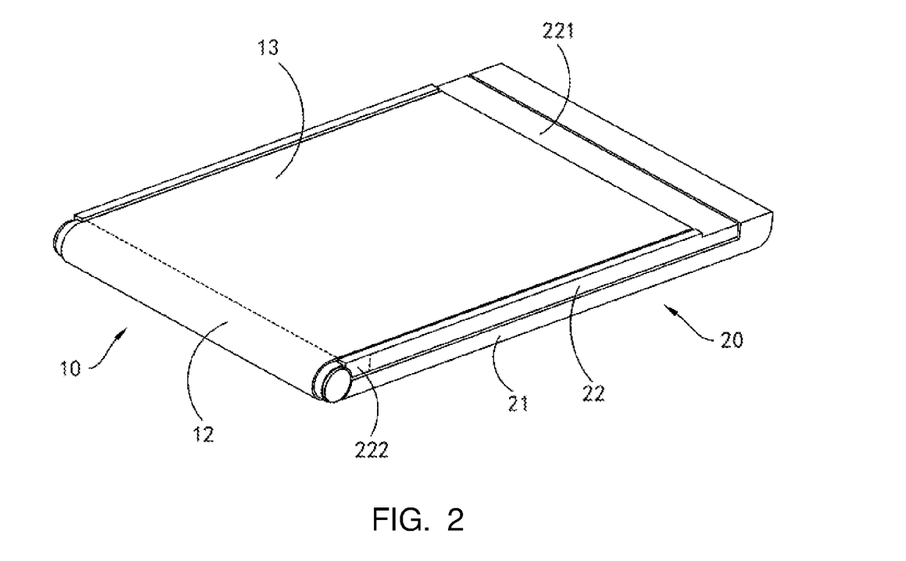
FIG. 2 is a structural schematic view showing the folded flexible display screen of the present disclosure, wherein a second surface of a second sliding base faces upward.

As shown in FIG. 1 and FIG. 2, FIG. 1 is a structural schematic view showing a folded flexible display screen 10, wherein the first surface 211 of the first sliding base 21 faces upward. FIG. 2 is a structural schematic view showing the folded flexible display screen 10, wherein the second surface 221 of the second sliding base 22 faces upward. When the flexible display screen 10 is in the folded state, the display area of the display part of the flexible display screen 10 disposed on the front side of the supporting base 20 is relatively small. Therefore, an entire size of the flexible display device is relatively small, which is beneficial for portability.

As shown in FIGS. 3 to 6, structural schematic views of an unfolded flexible display screen 10 are shown. When the flexible display screen 10 is in an unfolded state, the display area of the display part of the flexible display screen 10 disposed on the front side of the supporting base 20 is relatively large, which is beneficial for watching videos and playing games.

Figure 3:
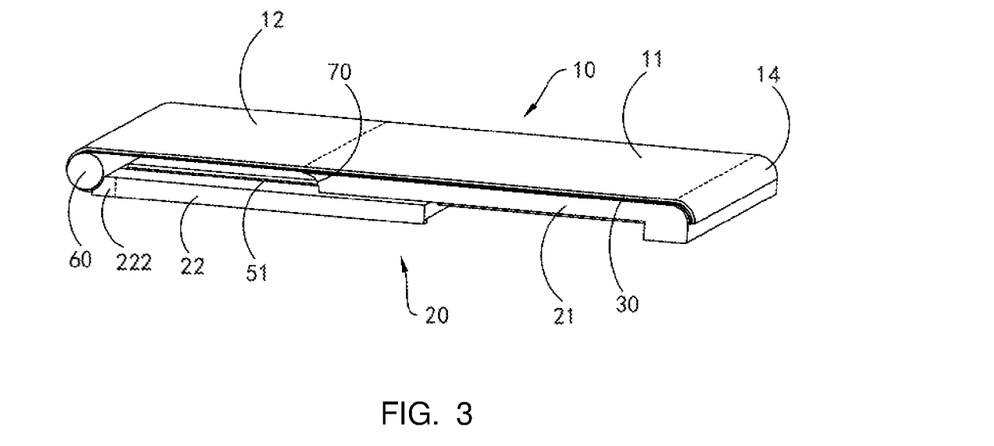
FIG. 3 is a structural schematic view showing an unfolded flexible display screen of the present disclosure, wherein the first surface of the first sliding base faces upward.
Figure 4:
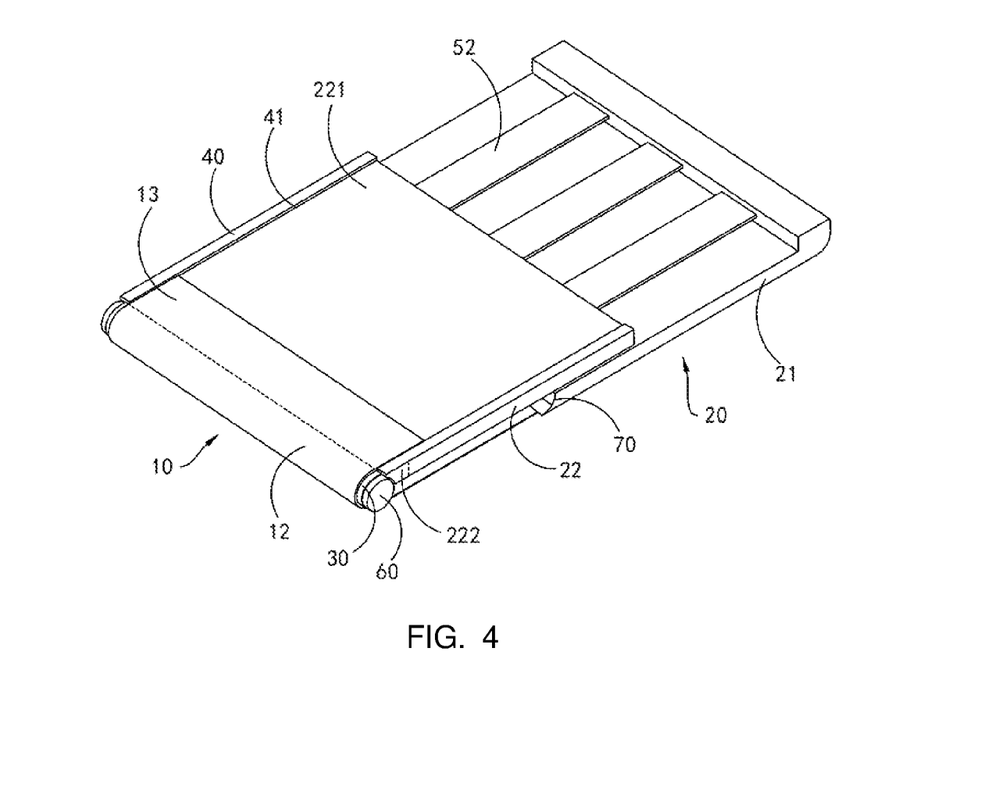
FIG. 4 is a structural schematic view showing the unfolded flexible display screen of the present disclosure, wherein the second surface of the second sliding base faces upward.
Figure 5:
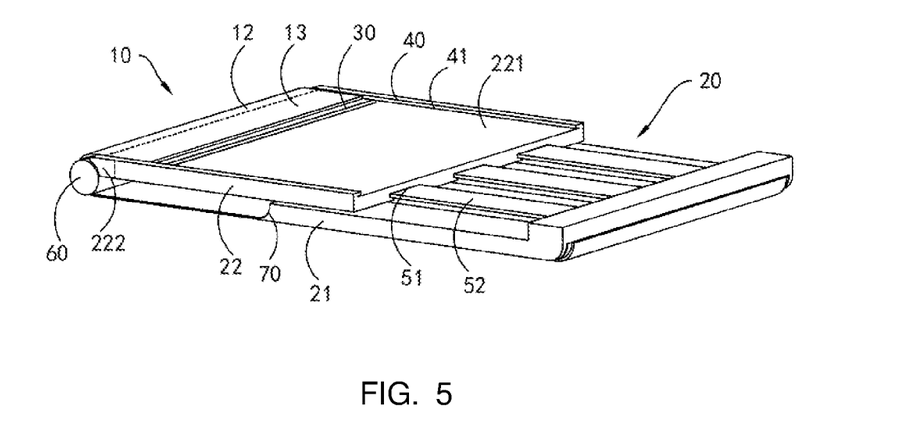
FIG. 5 is a structural schematic view showing the unfolded flexible display screen of the present disclosure, wherein the second surface of the second sliding base faces upward.

As shown in FIG. 2 and FIG. 3, when the flexible display device switches from the folded state as shown in FIG. 2 to the unfolded state as shown in FIG. 3, the first sliding base 21 moves rightward in relation to the second sliding base 22, thereby driving the first part 11 to move rightward. At the same time, the connecting part 12 drives the second part 13 to move leftward. At this moment, the length of the second part 13 along the first direction is reduced, and the length of the connecting part 12 along the first direction is increased. Therefore, the length of the display part disposed on the front side of the supporting base 20 is increased along the first direction, thereby allowing the flexible display device to switch from the folded state to the unfolded state.

It should be noted that the first sliding base 21 and the second sliding base 22 can have a solid structure or a hollow structure. The first sliding base 21 and the second sliding base 22 can be formed of metal, plastic, or wood.

As shown in FIGS. 3 to 6, a flexible supporting plate 30 is disposed between the flexible display screen 10 and the supporting base 20, and the flexible display screen 10 is fixedly attached to the flexible supporting plate 30.

By disposing the flexible supporting plate 30 between the flexible display screen 10 and the supporting base 20, the flexible supporting plate 30 can provide a supporting function. Therefore, people will not feel that the flexible display screen 10 is uneven when they use it.

Specifically, the flexible supporting plate 30 includes a fixed part corresponding to the first part 11, a sliding part corresponding to the second part 13, and a supporting part corresponding to the connecting part 12. The fixed part is fixedly connected to the first sliding base 21, and the sliding part is slidably connected to the second sliding base 22 along the first direction. The first sliding base 21 and the second sliding base 22 are slid in different directions along the first direction, thereby changing the length of the supporting part along the first direction.

The fixed part of the flexible supporting plate 30 supports the first part 11. The supporting part supports the connecting part 12. The sliding part supports the second part 13. When the first sliding base 21 and the second sliding base 22 move, each portion of the flexible supporting plate 30 is driven to move, and each portion of the flexible display screen 10 is driven to move accordingly. Therefore, pull forces generated when the first sliding base 21 and the second sliding base 22 move are applied to the flexible supporting plate 30, thereby preventing the flexible display screen 10 from being stretched due to deformation caused by long-term pull forces, and preventing the flexible display screen 10 from being damaged due to rubbing between the flexible display screen 10 and the supporting plate 20.

The fixed part, the sliding part, and the supporting part can be formed integrally. Alternatively, they can be formed respectively. Then, they are welded, articulated, or fixed in other ways to be assembled to form the flexible supporting plate 30.

Specifically, two sides of the second surface 221 are provided with a position-limiting blocking strip 40 connected to the second sliding base 22 along a second direction, a chute 41 is defined between the position-limiting blocking strip 40 and the second surface 221, a lateral side of the sliding part is disposed in the chute 41 along the second direction, and the second direction is perpendicular to the first direction.

It should be noted that the sliding part can be slid along the chute 41. The position-limiting blocking strip 40 limits a position of the sliding part disposed on the second surface 221, thereby allowing the sliding part to be attached to the second surface 221 and preventing the sliding part and the second base 20 from being separated caused by warpage of the sliding part. Furthermore, the first sliding base 21 is slid along a direction near the second sliding base 22. As a result, when the flexible display screen 10 switches from the unfolded state to the folded state, the sliding part of the flexible support plate 30 can be slid along the first direction following the fixed part because of not only the position-limiting blocking strip 40 limiting the position of the flexible supporting plate 30 but also a strength of the flexible supporting plate 30. As a result, part of the supporting part bypassing the second end 222 is prevented from warpage.

The supporting part 20 can be formed of materials having relatively strong strength, plasticity, and relatively strong bending resistance. A material of the supporting part 20 includes, but is not limited to, metal materials, such as steel, copper, iron, aluminum, copper alloy, iron alloy, or aluminum alloy, or non-metal materials, such as acrylic or polycarbonate.

Specifically, the second part 13 can be disposed between two position-limiting blocking strips 40. A gap is defined between the second part 13 and the position-limiting blocking strip 40, thereby preventing the flexible display screen 10 from being damaged due to rubbing between the second part 13 and the position-limiting blocking strip 40 during a sliding process.

Specifically, a lubricating layer can further be disposed between the sliding part and the position-limiting blocking strip 40 and between the sliding part and the second surface 221. The lubricating layer reduces friction between the sliding part and the position-limiting blocking strip 40. Therefore, when the flexible display screen 10 switches from the unfolded state to the folded state, part of the supporting part bypassing the second end 222 is prevented from warpage caused by overly large friction between the sliding part and the position-limiting blocking strip 40.

In one embodiment, the first sliding base 21 is disposed on a side of the second sliding base 22 away from the second surface 221, a T-shaped sliding block 52 is disposed on one of the first sliding base 21 or the second sliding base 22, and a T-shaped chute 51 corresponding to the T-shaped sliding block 52 is defined on the other one of the first sliding base 21 or the second sliding base 22. The first sliding base 21 and the second sliding base 22 are slidably connected to each other by the T-shaped sliding block 52 and the T-shaped chute 51 along the first direction.

It should be noted that both the T-shaped sliding block 52 and the T-shaped chute 51 extend along the first direction. By cooperation between the T-shaped sliding block 52 and the T-shaped chute 51, the first sliding base 21 and the second sliding base 22 can be slidably connected to each other along the first direction, thereby preventing separation between the first sliding base 21 and the second sliding base 22 during a sliding process.

FIGS. 3 to 6 only show a situation where the T-shaped sliding bock 52 is disposed on the first sliding base 21 and the T-shaped chute 51 is defined on the second sliding base 22. Alternatively, the T-shaped sliding block 52 can be disposed on the second sliding base 22, and the T-shaped chute can be defined on the first sliding base 21. In this case, the T-shaped sliding block 52 protruding from the second sliding base 22 can support the supporting part of the flexible supporting plate 30, thereby reducing an interval between part of the supporting part disposed on the front side of the supporting base 20 and the second sliding base 22. As a result, people will not feel the flexible display screen 10 uneven when they use it.

Specifically, the flexible display device further includes a supporting shaft 60 disposed along the second direction, and the supporting shaft 60 is disposed at the second end 222.

The connecting part bypasses a side of the supporting shaft 60 away from the second end 222. A vertex of the supporting shaft 60 away from the sliding part is aligned with the first surface 211. Changes in length of the connecting part 12 along the first direction are equal to changes in length of the second part 13 along the first direction when the first sliding base 21 and the second sliding base 22 are slid in opposite directions along the first direction.

When the flexible display device is in the unfolded state, the supporting part of the flexible supporting plate 30 includes a first split part bypassing the supporting shaft 60 and a second split part disposed on the front side of the supporting base 20. The supporting shaft 60 raises the second split part of the supporting part. Therefore, the second split part of the supporting part can be aligned with the fixed part, thereby improving display effect of the flexible display screen 10. Furthermore, when the first sliding base 21 and the second sliding base 22 are slid in opposite directions along the first direction, changes in length of the connecting part 12 along the first direction are equal to changes in length of the second part 13 along the first direction. For example, if an increased amount of the length of the connecting part 12 along the first direction is L, a decreased amount of the length of the second part 13 along the first direction is L.

In some embodiment, the supporting shaft 60 rotates around itself and is connected to the second end 222, thereby reducing rub between the supporting part and the supporting shaft 60.

It should be noted that the supporting shaft 60 can also be fixedly connected to the second end 222.

Specifically, an end of the first sliding base 21 near the second end 222 is provided with a curved surface 70, and the curved surface 70 is attached to a surface of the supporting shaft 60 when the first sliding base 21 is against the supporting shaft 60.

It can be understood that the flexible display device is in the folded state when the second sliding base 20 is against the supporting shaft 60. The curved surface 70 is attached to a surface of the supporting shaft 60, thereby reducing an interval between the first sliding base 21 and the supporting shaft 60. Therefore, people cannot feel that the flexible display screen 10 is uneven when they use it.

In one embodiment, the flexible supporting plate 30 is fixedly attached to the first surface 211. In this case, the second part 13 and the connecting part 12 of the flexible display screen 10 are bendable, and the first part 11 can be bendable or unbendable.

In one embodiment, the flexible supporting plate 30 further includes a first supporting end corresponding to the first end 14 of the flexible display screen 10. The first sliding base 21 includes a third end disposed away from the second end 222 of the second sliding base 22. The third end is provided with a curved surface. The first supporting end is fixedly attached to the curved surface to form a curved edge part, which is beneficial for holding the flexible display device with two hands to touch and control it.

It can be understood that the first end 14 and the first supporting part can also extend to a side of the first sliding base 21 away from the first surface 211.

Figure 6:
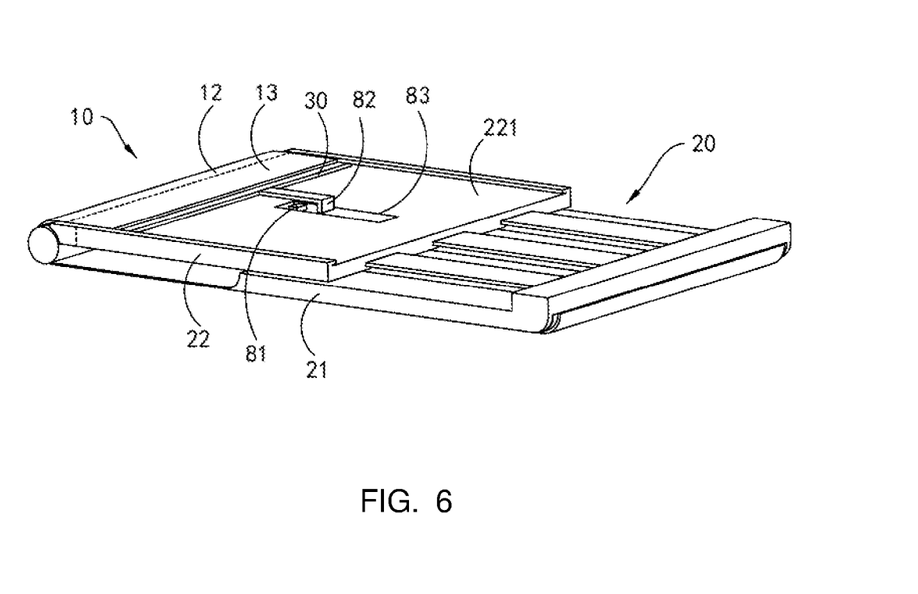
FIG. 6 is a structural schematic view showing the unfolded flexible display screen of the present disclosure, wherein the second surface of the second sliding base faces upward.

As shown in FIG. 6, in some embodiments, a first fixed block 81 is fixedly disposed on the second surface 211, a second fixed block 82 is fixedly disposed on the sliding part of the flexible supporting plate 30. The first fixed part 81 is positioned between the second fixed block 82 and the sliding part and is disposed on a sliding trajectory of the second fixed block 82. The second fixed block 82 is against the first fixed block 81 when the first sliding base 21 is slid to a predetermined position along a direction away from the second sliding base 22.

It should be noted that the flexible display device is fully unfolded when the first sliding base 21 is slid to the predetermined position. At this moment, the display area of the display part of the flexible display screen 10 disposed on the front side of the supporting base 20 is maximized. The first fixed block 81 is against the second fixed block 82, thereby limiting a position of the sliding part of the supporting plate 30 and preventing all parts of the flexible supporting plate 30 from being stretched to the front side of the supporting plate 20, causing the flexible display device to be unable to return to the folded state.

Specifically, the second sliding base 22 is provided with a position-limiting recess 83 extending along the first direction. The first fixed block 81 is disposed in the position-limiting recess 83. The second fixed block 82 is partly disposed in the position-limiting recess 83. When the first sliding base 21 and the second sliding base 22 are slid in different directions along the first direction, the second fixed part 82 is slid along the position-limiting recess 83.

An upper surface of the first fixed block 81 is lower than the second surface 221 or is aligned with the second surface 221, thereby preventing the flexible supporting plate 30 from being blocked by the first fixed block 81 when the flexible display device switches to the folded state.

Regarding the beneficial effects: due to the first sliding base 21 and the second sliding base 22, the flexible display screen 10 can be supported when being controlled by touching, which is beneficial for controlling the flexible display screen 10 by touching. In addition, people can find flexible display screen less dented when they touch and control the flexible display screens. Furthermore, the first sliding base and the second sliding base can be slid in opposite directions along the first direction. Therefore, the display area of the display part of flexible display screens disposed on the front side of the sliding base can be changed. Thus, flexible display screens can switch between a folded state and an unfolded state.

In the above embodiments, the focus of each embodiment is different, and for a part that is not detailed in an embodiment, reference can be made to related descriptions of other embodiments.

Embodiments provided by the present disclosure illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A flexible display device, comprising:
a supporting base, wherein the supporting base comprises a first sliding base and a second sliding base which are slidably connected to each other in a first direction, the first sliding base comprises a first surface, and the second sliding base comprises a second surface away from the first surface;
a flexible display screen, wherein the flexible display screen comprises a first part disposed on the first surface, a first end connected to the first part, a second part disposed on the second surface, and a connecting part connected to the first part and the second part;
wherein the second sliding base further comprises a second end away from the first end, the first part and the first sliding base are fixedly connected to each other, the second part and the second sliding base are slidably connected to each other along the first direction, the connecting part bypasses the second end, and a length of the connecting part along the first direction is changed when the first sliding base and the second sliding base are slid in opposite directions along the first direction;
wherein a flexible supporting plate is disposed between the flexible display screen and the supporting base and is fixedly connected to the flexible display screen, the flexible supporting plate comprises a sliding part corresponding to the second part, two sides of the second surface are provided with a position-limiting blocking strip connected to the second sliding base along a second direction, a chute is defined between the position-limiting blocking strip and the second surface along the first direction, a lateral side of the sliding part is disposed in the chute along the second direction, and the second direction is perpendicular to the first direction.

2. The flexible display device of claim 1, wherein the flexible supporting plate comprises a fixed part corresponding to the first part and a supporting part corresponding to the connecting part, and the flexible display screen is fixedly attached to the flexible supporting plate; and
wherein the fixed part is fixedly connected to the first sliding base, the sliding part is slidably connected to the second sliding base along the first direction, and a length of the supporting part along the first direction is changed when the first sliding base and the second sliding base are slid in opposite directions along the first direction.

3. The flexible display device of claim 2, wherein the second part is disposed between two position-limiting blocking strips, and a gap is defined between the second part and each of the two position-limiting blocking strips.

4. The flexible display device of claim 2, wherein a position between the sliding part and the position-limiting block strip and a position between the sliding part and the second surface are provided with a lubricating layer.

5. The flexible display device of claim 2, wherein the fixed part of the flexible supporting plate is fixedly attached to the first surface.

6. The flexible display device of claim 2, wherein the flexible supporting plate further comprises a first supporting end corresponding to the first end of the flexible display screen, the first sliding base comprises a third end away from the second end, the third end is provided with a curved surface, and the first supporting end is fixedly attached to the curved surface to form a curved edge part.

7. The flexible display device of claim 2, wherein a first fixed block is fixedly disposed on the second surface, a second fixed block is fixedly disposed on the sliding part of the flexible supporting plate, the first fixed part is positioned between the second fixed block and the sliding part and is disposed on a sliding trajectory of the second fixed block; and
wherein the second fixed block is against the first fixed block when the first sliding base is slid to a predetermined position along a direction away from the second sliding base.

8. The flexible display device of claim 7, wherein a position-limiting recess extending along the first direction is defined on the second sliding base, the first fixed block is disposed in the position-limiting recess, and part of the second fixed block is disposed in the position-limiting recess.

9. The flexible display device of claim 8, wherein an upper surface of the first fixed block is lower than or aligned with the second surface.

10. The flexible display device of claim 1, wherein the first sliding base is disposed on a side of the second sliding base away from the second surface, a T-shaped sliding block is disposed on one of the first sliding base or the second sliding base, a T-shaped chute corresponding to the T-shaped sliding block is disposed on the other one of the first sliding base or the second sliding base, and the first sliding base and the second sliding base are slidably connected to each other by the T-shaped sliding block and the T-shaped chute along the first direction.

11. The flexible display device of claim 10, further comprising a supporting shaft disposed along the second direction, the supporting shaft is disposed at the second end, and the second direction is perpendicular to the first direction;
wherein the connecting part bypasses a side of the supporting shaft away from the second end, a vertex of the supporting shaft away from the sliding part is aligned with the first surface; and
wherein changes in length of the connecting part along the first direction are equal to changes in length of the second part along the first direction when the first sliding base and the second sliding base are slid in opposite directions along the first direction.

12. The flexible display device of claim 11, wherein the supporting shaft rotates around itself and is connected to the second end.

13. The flexible display device of claim 11, wherein an end of the first sliding base near the second end is provided with a curved surface, and the curved surface is attached to a surface of the supporting shaft when the first sliding base is against the supporting shaft.

14. A flexible display device, comprising:
- a supporting base, wherein the supporting base comprises a first sliding base and a second sliding base which are slidably connected to each other in a first direction, the first sliding base comprises a first surface, and the second sliding base comprises a second surface away from the first surface;
- a flexible display screen, wherein the flexible display screen comprises a first part disposed on the first surface, a first end connected to the first part, a second part disposed on the second surface, and a connecting part connected to the first part and the second part;
- wherein the second sliding base further comprises a second end away from the first end, the first part and the first sliding base are fixedly connected to each other, the second part and the second sliding base are slidably connected to each other along the first direction, the connecting part bypasses the second end, and a length of the connecting part along the first direction is changed when the first sliding base and the second sliding base are slid in opposite directions along the first direction;
- wherein a flexible supporting plate is disposed between the flexible display screen and the supporting base and is fixedly connected to the flexible display screen, a first fixed block is fixedly disposed on the second surface, a second fixed block is fixedly disposed on the sliding part of the flexible supporting plate, the first fixed part is positioned between the second fixed block and the sliding part and is disposed on a sliding trajectory of the second fixed block; and
- wherein the second fixed block is against the first fixed block when the first sliding base is slid to a predetermined position along a direction away from the second sliding base.

15. A flexible display device, comprising:
- a supporting base, wherein the supporting base comprises a first sliding base and a second sliding base which are slidably connected to each other in a first direction, the first sliding base comprises a first surface, and the second sliding base comprises a second surface away from the first surface;
- a flexible display screen, wherein the flexible display screen comprises a first part disposed on the first surface, a first end connected to the first part, a second part disposed on the second surface, and a connecting part connected to the first part and the second part;
- wherein the second sliding base further comprises a second end away from the first end, the first part and the first sliding base are fixedly connected to each other, the second part and the second sliding base are slidably connected to each other along the first direction, the connecting part bypasses the second end, and a length of the connecting part along the first direction is changed when the first sliding base and the second sliding base are slid in opposite directions along the first direction; and
- wherein the flexible display device comprises a supporting shaft disposed along a second direction, the supporting shaft is disposed at the second end, the second direction is perpendicular to the first direction, and the supporting shaft rotates around itself and is connected to the second end.

\* \* \* \* \*